United States Patent [19]

Maekawa

[11] Patent Number: 5,708,455

[45] Date of Patent: Jan. 13, 1998

[54] ACTIVE MATRIX DISPLAY DEVICE

[75] Inventor: Toshikazu Maekawa, Kanagawa, Japan

[73] Assignee: Sony Corporation, Tokyo, Japan

[21] Appl. No.: 756,699

[22] Filed: Nov. 26, 1996

Related U.S. Application Data

[63] Continuation of Ser. No. 427,263, Apr. 24, 1995, abandoned.

[30] Foreign Application Priority Data

Apr. 22, 1994 [JP] Japan ............................. 6-107603

[51] Int. Cl.$^6$ ............................................. G09G 3/36
[52] U.S. Cl. ............................................. 345/100; 345/98
[58] Field of Search .................................. 345/98, 100, 103,
345/87, 93, 92, 90, 99, 127, 128, 129, 130,
131, 132, 144, 154; 349/33, 34, 35, 36,
37, 38, 39; 348/790, 791, 792, 793; H04N 3/14,
9/30

[56] References Cited

U.S. PATENT DOCUMENTS

| | | |
|---|---|---|
| 3,675,044 | 7/1972 | Vogelsberg . |
| 5,282,234 | 1/1994 | Murayama et al. . |

FOREIGN PATENT DOCUMENTS

| | | |
|---|---|---|
| 0 456 165 A2 | 1/1992 | European Pat. Off. . |
| 0 607 778 A1 | 7/1994 | European Pat. Off. . |
| 0 632 646 A2 | 4/1995 | European Pat. Off. . |
| 0 660 592 A1 | 6/1995 | European Pat. Off. . |
| 2143781 | 6/1990 | Japan . |

*Primary Examiner*—Xiao Wu
*Attorney, Agent, or Firm*—Hill, Steadman & Simpson

[57] ABSTRACT

An active matrix display device comprises a plurality of pixels, a vertical scanning circuit, a horizontal addressing circuit, a wide input switch element and a normal input switch element. The plurality of pixels are arrayed in a matrix shape. The vertical scanning circuit sequentially selects pixels every line. The horizontal addressing circuit dot-sequentially addresses selected line pixels and has a shift register constituted by a number of multi-stage connected flip-flops, the number of which corresponds to the total number of rows of pixels. Each flip-flop is equipped with a pair of input/output terminals and a prescribed start pulse is transferred every stage. The wide input switch element inputs a start pulse to an input terminal of a flip-flop positioned at a leading stage during wide displaying. The normal input switch element inputs a start pulse to an input of a flip-flop positioned at a specific intermediate stage during normal displaying. It is therefore possible to switch over between a wide display and a normal display using a horizontal addressing circuit employing a single shift register.

10 Claims, 8 Drawing Sheets

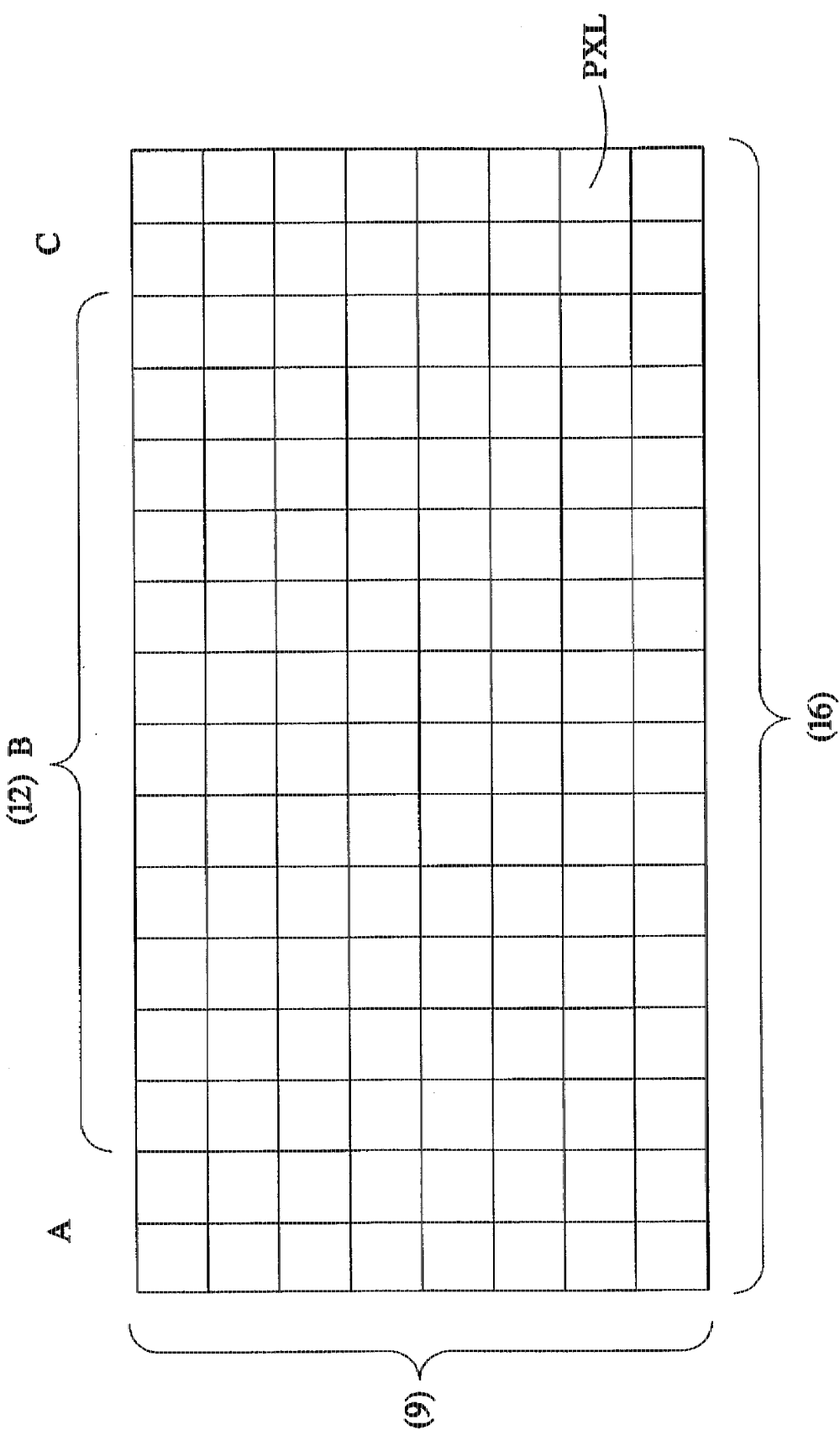

1H

1H 5,708,455

ACTIVE MATRIX DISPLAY DEVICE

This is a continuation, of application Ser. No. 08/427, 263, filed Apr. 24, 2995, now abandoned.

BACKGROUND OF THE INVENTION

1. Field of the Invention

The present invention relates to an active matrix display device, and more particularly to a driving method for an active matrix display device capable of changing over between a wide display of respect ratio 16:9 and a normal display of aspect ratio 4:3, and a construction of a horizontal addressing circuit for dot-sequentially addressing pixels.

2. Description of Related Art

In recent years, active matrix display devices have been developed in accordance with a high vision technical standard. As can be seen from FIG. 7, active matrix display devices which are in accordance with high vision regulations have a wide screen and wide displays of an aspect ratio of 16:9 are possible. In order to satisfy a 16:9 aspect ratio, numerous pixels PXL are arranged in an array. On the other hand, active matrix display device having a usual screen size can carry out a normal displaying of an aspect ratio of 4:3. A high vision standard active matrix display device structured so as to be capable of being changed over between a wide display and a normal display are therefore well-known. As shown in the drawing, desired displaying is carried out using all of the pixel rows in the case of a wide displaying. On the other hand, the screen is structured so that, for example, only a central region B of the entire pixel rows are used, so that an aspect ratio of 4:3 can be changed over to normal displaying. At this time, both of the end regions A and C may be, for example, blacked out.

Various means have been proposed for wide display and normal display changeover methods, for example, the kind of video signal compression method shown in FIG. 8. As shown in FIG. 8A, when a video signal for normal displaying is input, this video signal is first A/D converted into digital data. Compression processing is then carried out every one horizontal period (1H) at a desired ratio as shown in FIG. 8B so that only the central region B (FIG. 7) of this digital data is distributed. The compression-processed digital data is distributed over region B and fixed data is provided so as to provide a mask display at both end regions A and C (FIG. 7). However, this is expensive since digital processing circuitry added externally in this compression processing method is of a large scale. Structures where mechanical shutters arranged at the regions A and C at both ends have also been proposed in place of display masking, depending on electrical processes. However, the structures necessary for these mechanisms are complicated and are the cause of failures.

SUMMARY OF THE INVENTION

It is therefore an object of the present invention to provide an active matrix display device which resolves the above-mentioned problems.

In order to achieve this object, an active matrix display device comprises a plurality of pixels, a vertical scanning circuit, a horizontal addressing circuit, a wide input switch element and a normal input switch element. The plurality of pixels are arrayed in a matrix shape. The vertical scanning circuit sequentially selects pixels every line. The horizontal addressing circuit dot-sequentially addresses selected line pixels and has a shift register constituted by a number of multi-stage connected flip-flops, the number of which corresponds to the total number of rows of pixels. Each flip-flop is equipped with a pair of input/output terminals and a prescribed start pulse is transferred every stage. The wide input switch element inputs a start pulse to the input terminal of the flip-flop positioned at a leading stage during wide displaying. The normal input switch element inputs a start pulse to the input of the flip-flop positioned at a specific intermediate stage during normal displaying.

According to the present invention, a shift register, where a number of flip-flops corresponding to the entire number of rows of pixels, are multi-stage connected in accordance with wide displaying. In the case of wide displaying, horizontal addressing is carried out with all of the flip-flop stages included in the shift register being driven. During normal displaying, horizontal addressing is carried out with just a portion of the stage flip-flops being driven. An operation can then be performed so that the wide display and the normal display can be easily switched over between. The wide input switch element and the normal input switch element are provided at the horizontal addressing circuit for this purpose. Wide displaying is carried out by the wide input switch element injecting a start pulse i.e. data, at the input terminal of the flip-flop positioned at the leading stage and data is then transferred until the final stage flip-flop. The normal input switch element injects a start pulse at the input terminal of a flip-flop positioned at a specific intermediate stage and discontinues data transfer at a separate intermediate stage so that normal displaying is carried out. This wide input switch element and normal input switch element are each arranged in the vicinity of their respective flip-flops so that the horizontal addressing circuit has a compact layout. Also, dummy input switch elements are connected in place of the aforementioned wide input switch element and normal input switch element at the input/output terminals of flip-flops at positions other than the leading stage and specific intermediate stages so that load adjustment can be carried out. In this way, the load becomes equal at all the stages at the time of data transfer and the joint of the wide display and the normal display is not visible on the screen. Furthermore, the potential of the input terminal of the flip-flop positioned at the head of the temporarily redundant stages at the time of normal displaying is fixed by a pull-down/pull-up element. Noise can therefore not be seen on the screen because the logic conditions of the flip-flops belonging to the temporarily redundant stages are fixed. Connection gate elements are also provided between pairs of flip-flops positioned at the joint of the wide display and the normal display. The shift register is therefore reliably divided by the blocking of the transfer of data at the joint during normal displaying. Transfer gate elements are also provided between the flip-flop input/output terminals of neighboring stages. Data transfer can therefore be controlled to be in the forward or the reverse direction and inverted displaying is possible. This inverted displaying would be necessary in cases where, for example, the active matrix display device is used as a projector or the like.

BRIEF DESCRIPTION OF THE DRAWINGS

FIG. 7 is a scale drawing showing a screen capable of being switched over between a wide display and a normal display.

DETAILED DESCRIPTION OF THE PREFERRED EMBODIMENTS

Embodiment

Figure 1:
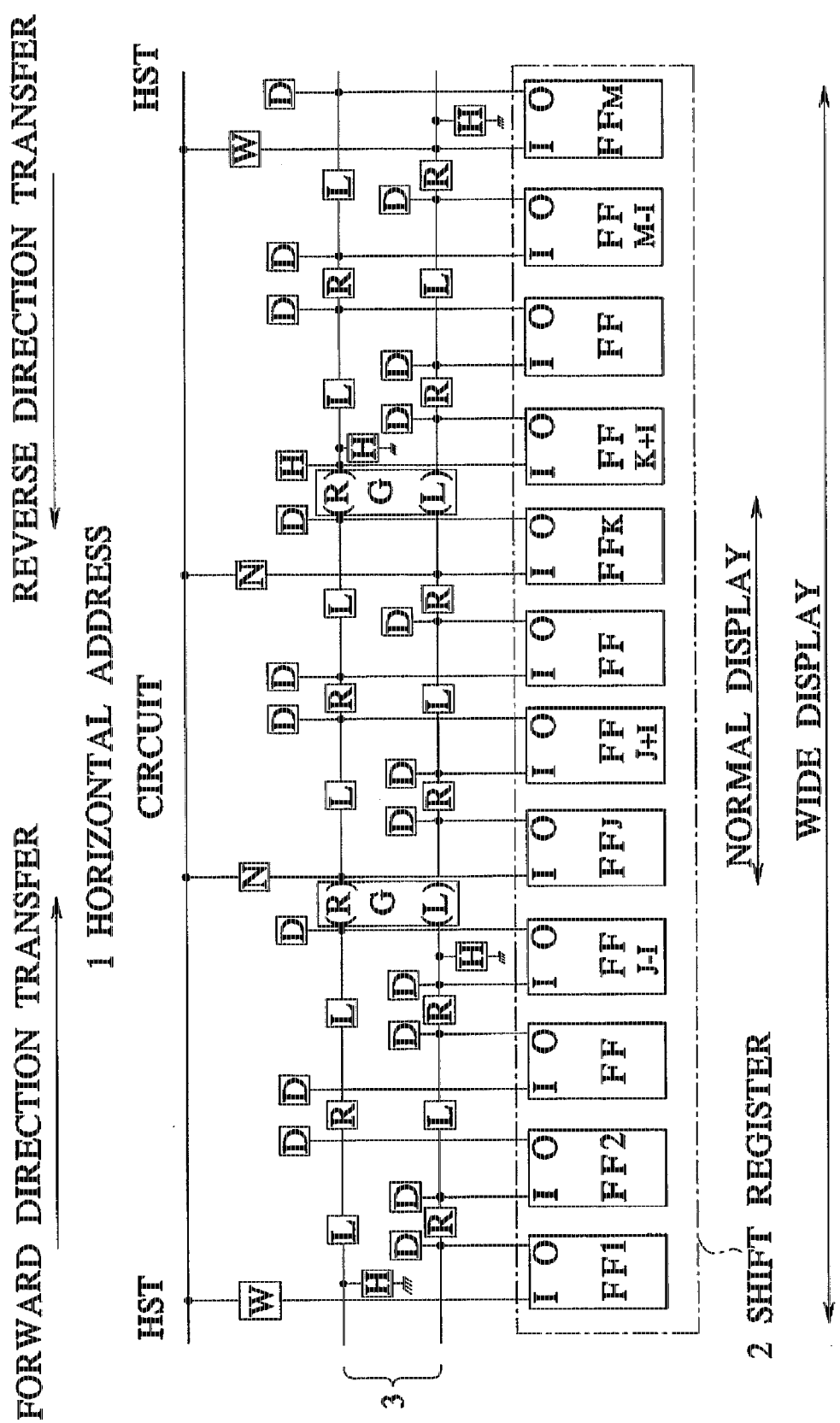
FIG. 1 is a block diagram showing the entire construction of a horizontal addressing circuit present in the main structural element of the active matrix display device of an example of the present invention.

The following is a detailed description with reference to the drawings of a suitable embodiment of the present invention. FIG. 1 is a block diagram of a horizontal address circuit which constitutes an essential part of an active matrix display device of the present invention. A horizontal address circuit 1 similarly shown in the diagram has a single shift register 2 which dot-sequentially addresses pixels (not shown in the diagrams) transferred with each step of a prescribed start pulse HST. This shift register 2 is comprised of a number of multiple stage-connected flip-flops, each being equipped with a pair of terminals consisting of an input terminal I and an output terminal O, with this number corresponding to the total number of rows of pixels. Each of the input/output terminals of the flip-flops are sequentially connected via two data transfer paths 3. In this embodiment, the M flip-flops from the leading stage $FF_1$ to the final stage $FF_M$ are connected in multi-stage fashion. If all of the "M" flip-flops are driven, then wide displaying is carried out. An intermediate stage includes the flip-flops from $FF_J$ to $FF_K$ within the M flip-flops and these are selectively driven during normal displaying. In this case, operation of $FF_1$ to $FF_{J-1}$ and $FF_{K+1}$ to $FF_M$ which are not included in the intermediate stages is halted and these stages become temporarily redundant. A pair $FF_{J-1}$ and $FF_J$ and another pair $FF_K$ and $FF_{K+1}$ are positioned at the joint of the wide display and the normal display.

The shift register 2 in this embodiment is bi-directional and is capable of selectively performing forward transfers i.e. a transfer from left to right in the drawings, and reverse transfers i.e. a transfer from right to left in the drawings, of data. For this purpose, transfer gate elements L and R are provided between the input/output terminals of pairs of flip-flops positioned next to each other. It is then possible to control data transfer to be in the forward direction or the reverse direction so that pixels can be bi-directionally addressed by alternately opening and closing the transfer gate elements L and R. This kind of reversible display is necessary in the case of, for example, an active matrix display device projector. Referring specifically to FIG. 1, for example, a transfer gate element L is provided in one direction between the input terminal of $FF_1$ and the output terminal of $FF_2$. Also, a transfer gate element R is provided in the other direction between the output terminal O of $FF_1$ and the input terminal I of $FF_2$. Transfer gate elements R and L are similarly provided hereinafter between the input terminals of neighboring flip-flops. When the transfer gate element R is open and the other transfer gate element L is closed, the start pulse HST is sequentially sent in the forward direction via the data transfer path 3. Alternatively, when the transfer gate element R is closed and the other transfer gate element L is open, the start pulse HST is sequentially sent in the reverse direction via the data transfer path 3.

The horizontal address circuit 1 has a wide input switch element W and a normal input switch element N. The wide input switch element W injects the start pulse HST to the input terminal of the flip-flop positioned at the leading stage at the time of wide displaying. The normal input switch element N injects a start pulse HST to the input terminals of flip-flops positioned at specific intermediate stages at the time of normal displaying. As $FF_1$ is the leading stage in the forward transfer direction, a wide input switch element W is connected to it's input terminal I. On the other hand, since $FF_M$ becomes the leading stage when transferring in the reverse direction, a wide input switch element W is also connected to it's input terminal I. Also, for forward direction transfer during normal displaying, $FF_J$ applies to a specific intermediate stage and a normal input switch element N is connected to it's input terminal I. i.e. $FF_J$ is the leading stage at the time of normal displaying. For transfers in the reverse direction, $FF_K$ becomes the normal display leading stage and a normal input switch element N is connected to it's input terminal I in the same way. In the case of either transfers in the forward direction or transfers in the reverse direction, the start pulse HST injected into the leading stage is transferred until the last stage. In this way, in the case of transferring in the forward direction while displaying normally, the start pulse HST injected at $FF_J$ is transferred as far as $FF_K$. In the case of reverse direction transfers, injections taking place at $FF_K$ are transferred until $FF_J$. Operation of $FF_1$ to $FF_{J-1}$ and $FF_{K+1}$ to $FF_M$ which are not included in the intermediate stage is halted and these stages become temporarily redundant. In this way, by employing the wide input switch element W and the normal input switch element N, corresponding to wide displaying and normal displaying respectively, in an appropriate manner, a single shift register 2 can be commonly used for both. The layout of the horizontal address circuit 1 is kept compact by arranging the wide input switch element W and the normal input switch element N in the vicinity of their corresponding flip-flops.

Load adjustment dummy input switch elements D are connected to the input/output terminals of flip-flops which are outside of the leading stage ($FF_1$ in the forward transfer direction and $FF_M$ in the reverse transfer direction) and the aforementioned specific intermediate stages ($FF_J$ in the forward direction and $FF_K$ in the reverse direction). These dummy input switch elements D have the same capacity as the wide input switch elements W and the normal input switch elements N and are provided at the input terminals I and output terminals O of each flip-flop so as to average out the load. Conversely, if these dummy input switch elements D are not provided, the load will be heavy when data is transferred only at the stages $FF_J$ and $FF_K$, delays etc. will occur in data transfers and a line will be visible on the screen at the joint of the normal display and the wide display.

In addition to the aforementioned elements, the horizontal address circuit 1 has a pull-down/pull-up element H. These pull-down/pull-up elements H are connected to and fix the potential of the input terminals positioned at the head of the temporarily redundant stages not related to the dot-sequential addressing of the pixels at the time of normal displaying. The flip-flops positioned at the head of the temporarily redundant stages when transferring in the forward direction are $FF_1$ and $FF_{K+1}$ and $FF_M$ and $FF_{J-1}$ when transferring in the reverse direction. Pull-down/pull-up elements are therefore connected to each of the input terminals of these four flip-flops. In this example, each input terminal is pulled down to the level of an earth connection. A power supply level pull-up construction would also be possible. The logic conditions of the flip-flops $FF_1$ to $FF_{J-1}$ and $FF_{K+1}$ to $FF_M$ belonging to the temporarily redundant stages can be fixed by providing the pull-down/pull-up elements H so that picture noise etc. can be prevented.

Connection gate elements G are provided between the pair of flip-flop input/output terminals positioned at the joint of wide display and the normal display of the horizontal address circuit 1. Specifically, connection gate elements are provided between $FF_{J-1}$ and $FF_J$, and between $FF_K$ and $FF_{K+1}$. In this way, on the one hand, data transferal at the joints when wide displaying is taking place is possible, while in the same way, data transferal at the joints at the time of normal displaying can be prevented. According to this structure, the splitting-up of each of the flip-flops for normal displaying and wide displaying can be achieved reliably with a single shift register 2. At the time of wide displaying, the connection gate elements have a function equivalent to that of the aforementioned transfer gate elements R and L.

Figure 2:
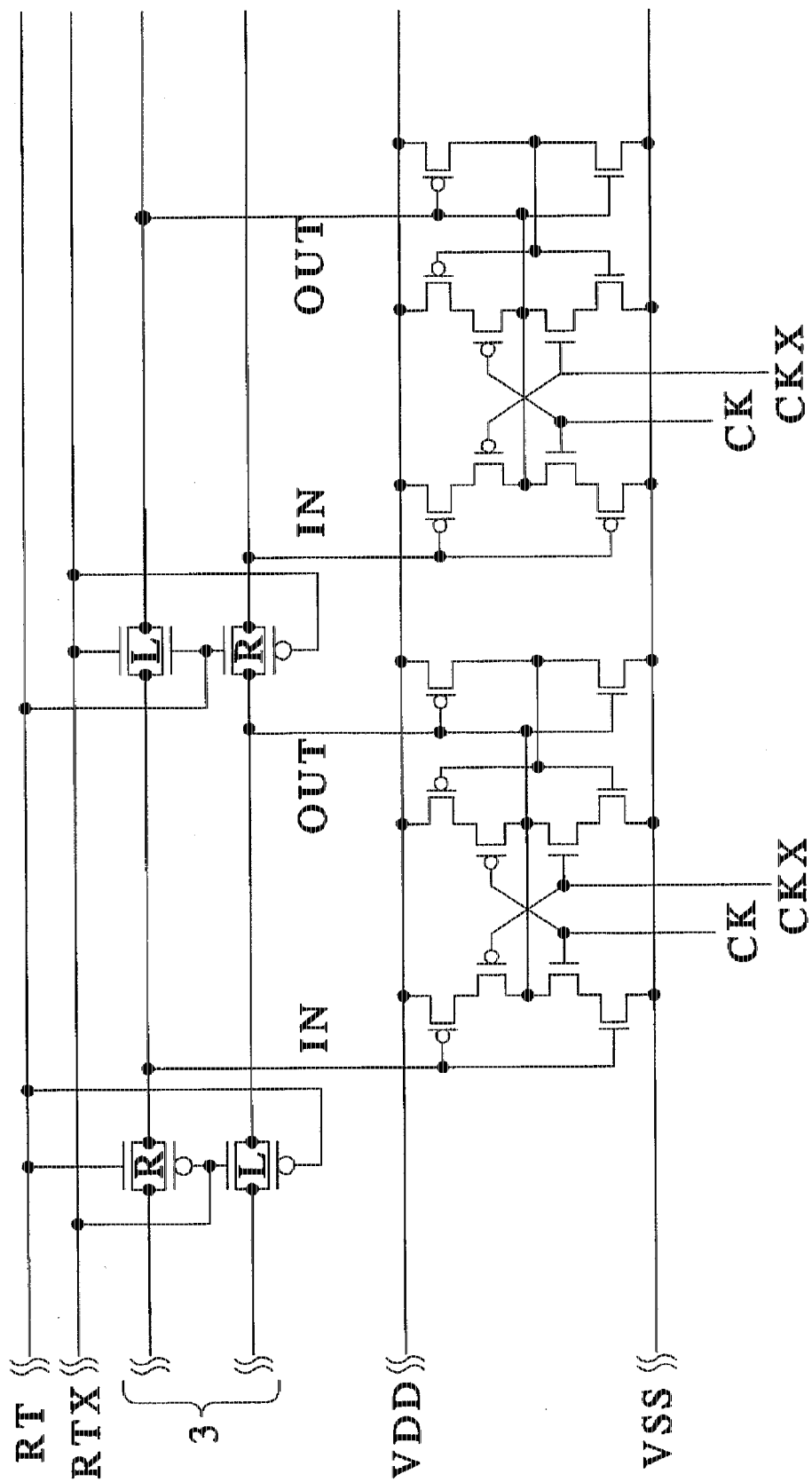
FIG. 2 is a circuit diagram partially showing an example of a specific structure of the horizontal addressing circuit shown in FIG. 1.

FIG. 2 is a circuit diagram partially showing an example circuit structure of the horizontal address circuit 1 shown in FIG. 2. In order to mainly explain the bi-directional transfer of data, just two flip-flops (a leading flip-flop and a following flip-flop) and accompanying transfer gate elements R and L are shown. In this example, all of the circuit elements are constructed from thin-film transistors (TFTs). However, the present invention is by no means limited to this and it would also be possible to use bipolar transistors or MOS transistors. The leading stage and the following stage are both constructed from D-type flip-flops. Each D-type flip-flop consists of first and second clocked inverters and a third inverter and operate on clocks CK and CKX of opposite phases. The flip-flops delay data inputted from the input terminal IN by a portion of half a period of a clock signal and then send an output to the output terminal OUT The transfer gate elements R and L each consist of CMOS type transmission gate elements. However, the present invention is by no means limited to this example, and the use of only NMOS or PMOS analog switches as the transfer gate elements is also possible. The transfer gate elements R and L are controlled by control signals RT and RTX of mutually opposite phases provided by a control means (not shown in the drawings). When one control signal RT is a high level so that the other control signal RTX is a low level, one transfer gate element R is open and the other transfer gate element L is closed. At this time, data is provided to the input terminal IN of the preceding stage flip-flop via the initial transfer gate element R. After delay processing for delaying by just half a period of the clock signal has been carried out, transferring is carried out from the output terminal OUT to the input terminal IN of the following stage flip flop via the next transfer gate element R. In this way, data can be sequentially transferred in the forward direction. On the other hand, when a changeover is performed so that the control signal RT is low and the control signal RTX is high, one of the transfer gate elements R is closed and the other transfer gate element L is open. In this case, after data transferred in the reverse direction is provided to the input terminal IN of the following stage FLIP-FLOP and prescribed delay processing is carried out and the data is transferred from the output terminal OUT to the input terminal IN of the preceding stage FLIP-FLOP via the transfer gate element L. Data outputted from the output terminal OUT reaches the next transfer gate element L after a prescribed delay process has again been carried out.

Figure 3:
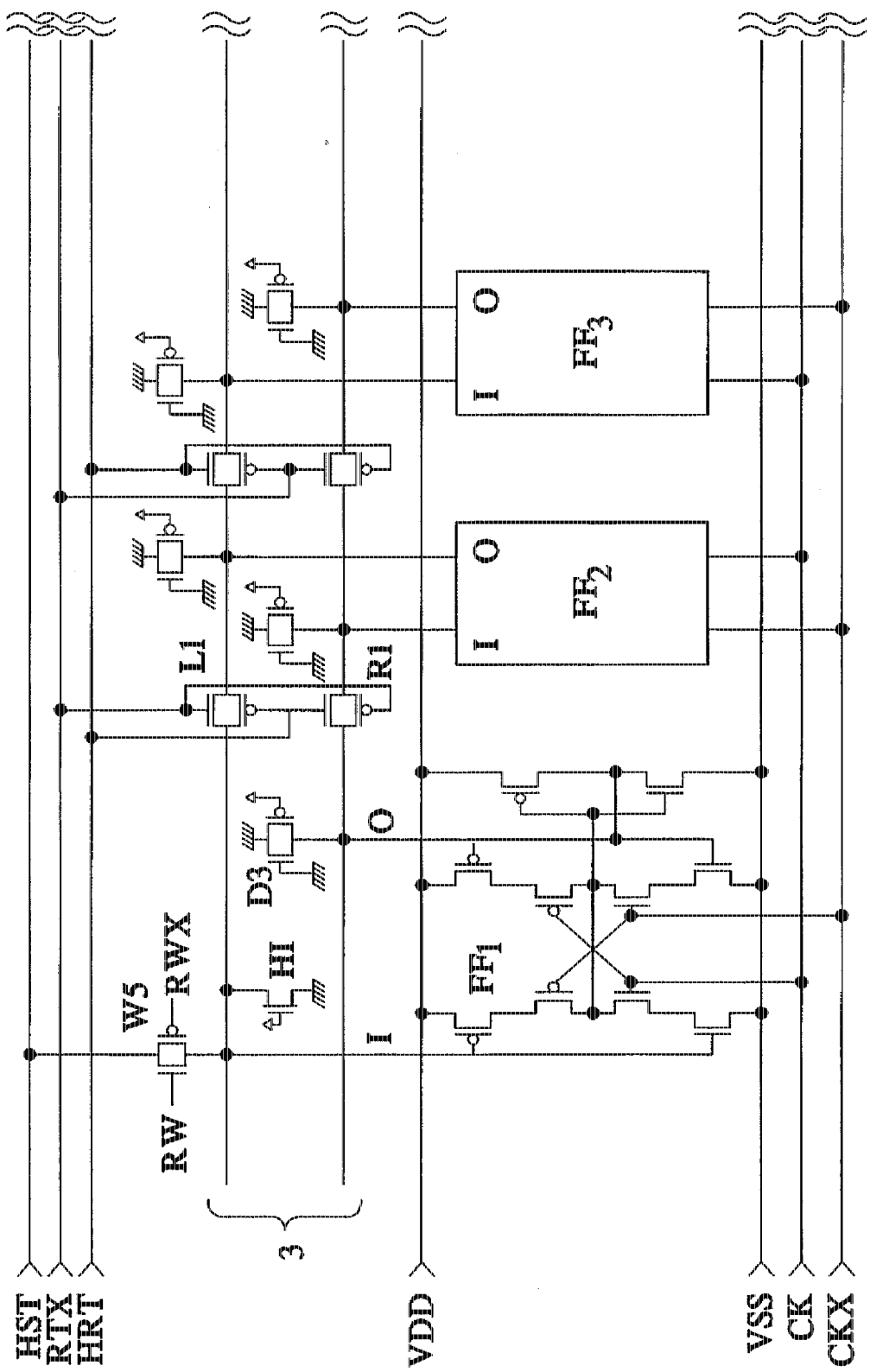
FIG. 3 is a detailed circuit diagram of a portion of the horizontal addressing circuit shown in FIG. 1.
Figure 4:
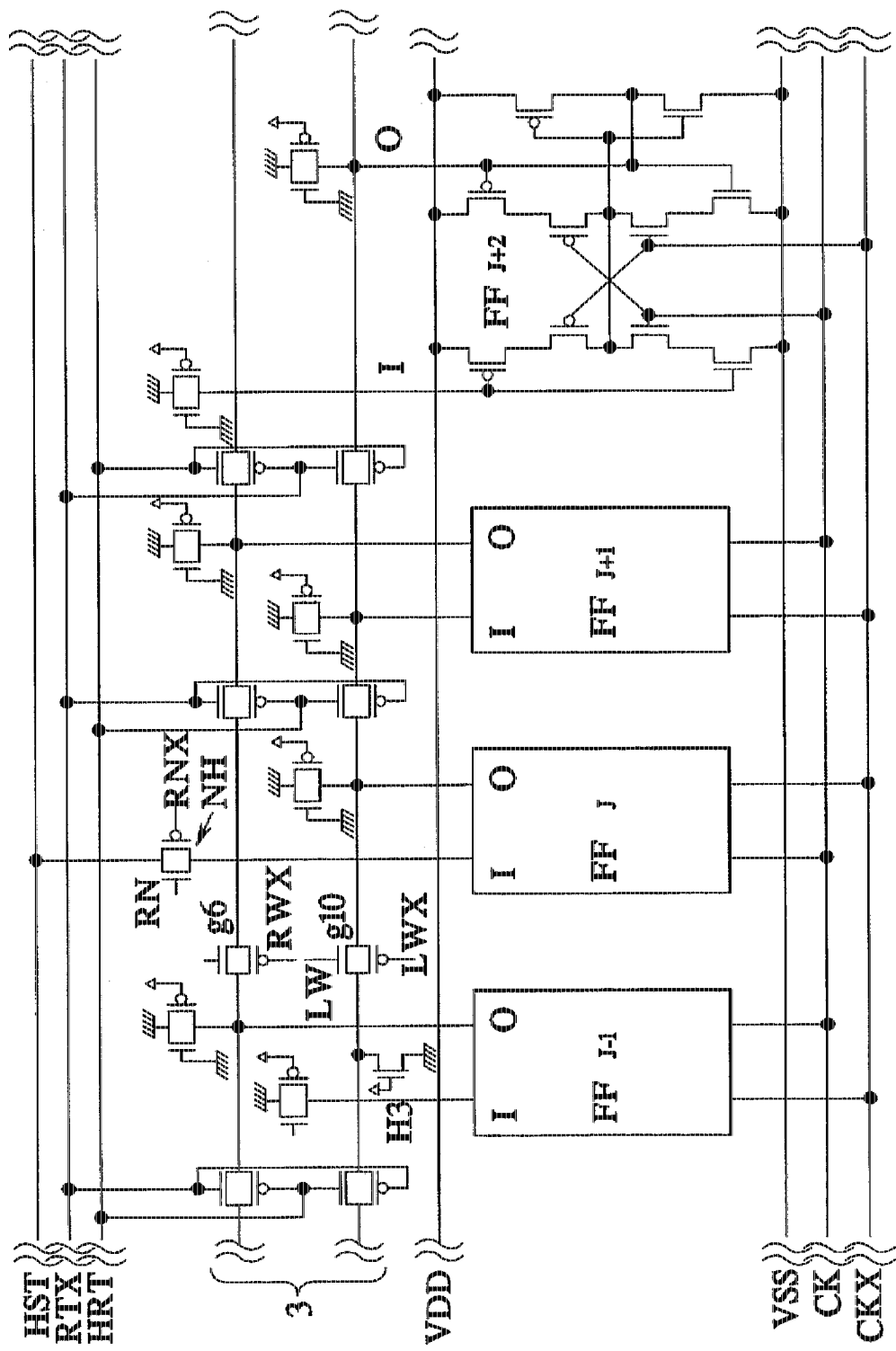
FIG. 4 is a detailed circuit diagram of a further portion of the horizontal addressing circuit shown in FIG. 1.
Figure 5:
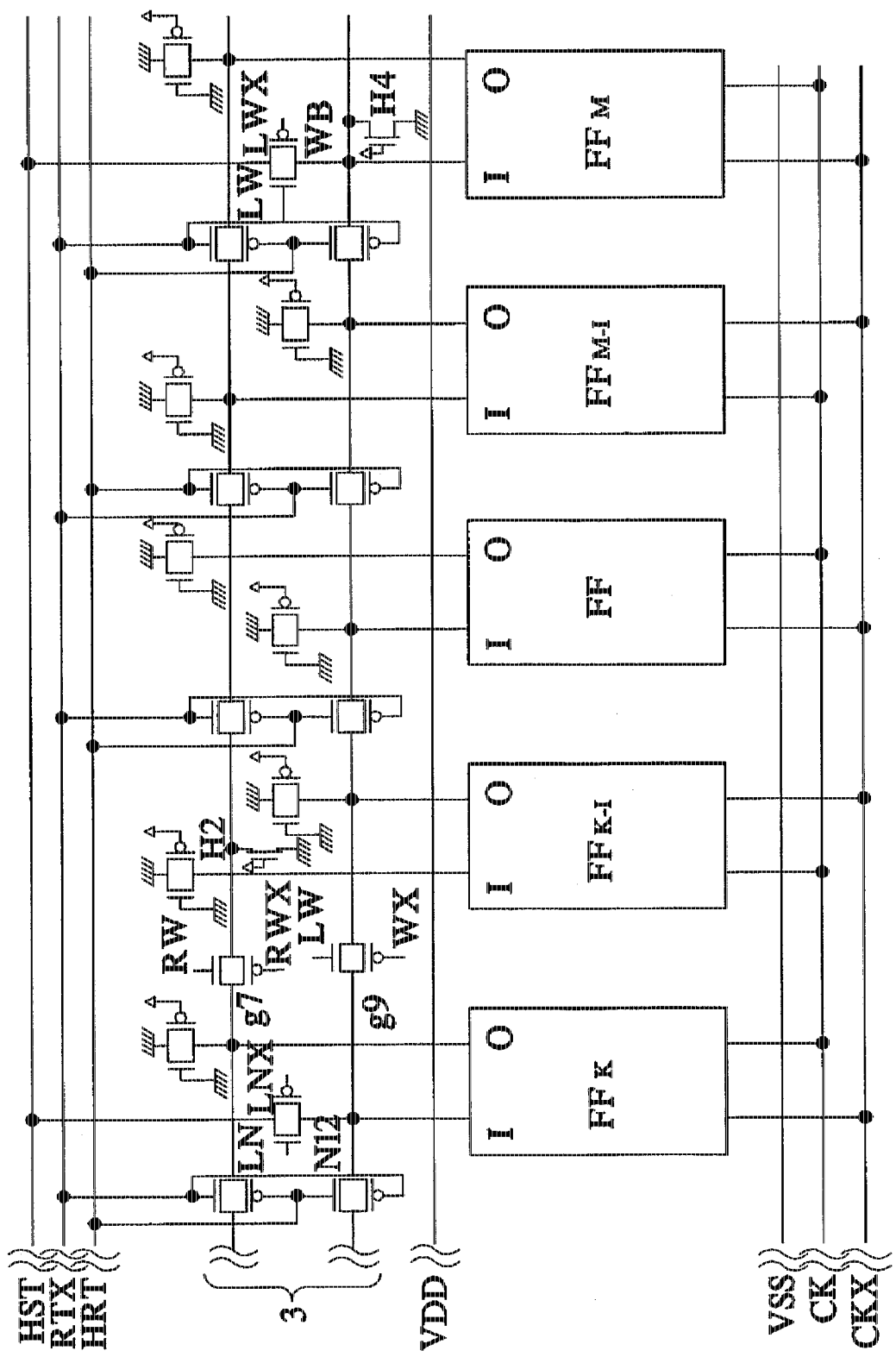
FIG. 5 is a detailed circuit diagram of another portion of the horizontal addressing circuit shown in FIG. 1.

FIGS. 3 to 5 are circuit diagrams showing an example of the overall structure of the horizontal address circuit 1 shown in FIG. 1. Basically, the flip-flop construction shown in FIG. 2 is multi-stage connected in sequence from the leading stage $FF_1$ to the final stage $FF_M$. FIG. 3 shows $FF_1$ to $FF_3$, FIG. 4 shows $FF_{J-1}$ to $FF_{J+2}$, and FIG. 5 shows $FF_K$ to $FF_M$. From FIG. 3 through to FIG. 5, in addition to the transfer gate elements R and L, the detailed construction of a wide input switch element W, a normal input switch element N, a dummy input switch element D, a pull-down/pull-up element H and a connection gate element G are also shown.

For example, as shown in FIG. 3, a wide input switch element W5 comprised of transmission gate elements is connected to the input terminal I of $FF_1$. This wide input switch element W5 is controlled to be opened or closed by control signals RW and RWX of mutually opposite phases. Also, as shown in FIG. 3, a pull-down/pull-up element H1 is connected to the input terminal K of $FF_1$. In this example, an N-channel type thin film transistor is used as the pull-down/pull-up element H, but a high resistance element such as polysilicon may also be used. Further, as shown in FIG. 3, a diode input switch element D3 is connected to the output terminal of $FF_1$. In this embodiment, all of the diode input switch elements D are constituted by CMOS transmission gate elements. It would also be possible to use a single channel transistor. Also, as shown in FIG. 3, a transfer gate element R1 lies between the output terminal O of $FF_1$ and the input terminal I of $FF_2$, and another transfer gate element L1 lies between the input terminal I of $FF_1$ and the output terminal O of $FF_2$. As mentioned previously, all of the transfer gate elements R and L are controlled so as to be opened and closed by control signals RT and RTX having opposite phases.

Next, moving on to FIG. 4, a connection gate element G lies between $FF_{J-1}$ and $FF_J$. Here, the connection gate element G is constituted by a combination of a pair of transmission gate elements g6 and g10. One of the transmission gate elements g6 is controlled so as to be opened and closed by control signals RW and RWX of opposite polarity and the other transistor gate element g10 is controlled so as to be opened and closed by control signals LW and LWX which are also of opposite polarities. Also, a normal input switch N11 is connected to the input terminal of $FF_J$. This normal input switch element N11 is controlled so as to be opened and closed by control signals RN and RNX of mutually opposite polarities.

Further, going on to FIG. 5, a normal input switch element N12 is connected to the input terminal of $FF_K$ and is opened and closed by the control signals LN and LNX. Also, a connection gate element G is provided between $FF_K$ and $FF_{K+1}$. This connection gate element G is constituted by a pair of transmission gate elements g7 and g9. One of the transmission gate elements g7 is controlled so as to be opened and closed by control signals RW, and RWX and the other transmission gate element g9 is controlled so as to be opened and closed by the control signals LW and LWX. A pull-down/pull-up element H2 is connected to the input terminal of $FF_{K+1}$. Finally, a wide input switch element W8 is connected to the input terminal of $FF_M$ and is controlled to be opened and closed by control signals LW and LWX. A pull-down/pull-up element H4 is also connected to the input terminal I of $FF_M$.

Next, the circuit operation will be described in detail for FIG. 3 through FIG. 5. Of the aforementioned control signals, RT becomes a high level during transfers in the forward direction. Also, RW only goes high for transfers in the forward direction at the time of wide displaying, and "LW" only goes high for transfers in the reverse direction during wide displaying. Further, "RN" only goes high for transfers in the forward direction during normal displaying and LN only goes high for transfers in the reverse direction during normal displaying.

For simplicity, the operation is described in divided up fashion between the following cases. First, at the time of carrying out wide displaying in the forward direction, a start pulse HST is input to the input terminal I of $FF_1$ via the wide input switch element W5. The input start pulse HST is then transferred in the forward direction i.e. to the right, as data. The data is transferred without modification upon reaching the Jth stage positioned at the joint of the wide display and the normal display because the transmission gate element g6 is on. At the following K+1th stage corresponding to a joint the data passes without modification because the transmission gate g7 is also on, and the data reaches the final stage $FF_M$.

The following is a description of the case where normal displaying is carried out in the forward direction. In this case, data is not provided to the temporarily redundant stages $FF_1$ to $FF_{J-1}$, and $FF_{K+1}$ to $FF_M$. As a result of this, it is necessary to fix the logic conditions of each flip-flop and the input terminals of $FF_1$ and $FF_{K+1}$ are pulled down by H1 and H2, respectively. In this way, each flip-flop is fixed at a "0" level. The start pulse HST is then provided to the input terminal $FF_J$ via N11 and is transferred in the forward direction i.e. to the right. Data is transferred up to the Kth stage, but g7 being a OFLIP-FLOP becomes a barrier with respect to the K+1th stage. Data therefore only transferred to $FF_J$ to $FF_K$.

Next, the case of wide displaying for transfers in the reverse direction is described. A start pulse HST is provided to the input terminal of $FF_M$ via W8. The signal HST provided is transferred as data in the reverse direction i.e. to the left. Data then passes through because g9 is on at the Kth stage at the initial point. Data transfer is then continued because g10 is also on at the J−1th stage present at the next joint, until, finally, $FF_1$ is reached.

Lastly, the case for transfers in the reverse direction for normal displaying is described. Data transferring is not carried out at the redundant stages $FF_{K+1}$ to $FF_M$ and $FF_M$ to $FF_{J-1}$. As a result of this, it is necessary to fix the conditions of each flip-flop. The input terminal of $FF_M$ is therefore pulled down by H4 and the input terminal of $FF_{J-1}$ is pulled down by H3. In this way, each flip-flop is fixed at zero. The start pulse HST is then provided to the input terminal of $FF_K$ via N12 so as to be transferred in the reverse direction i.e. to the left. Data transfer is then prevented after $FF_{J-1}$ of the joint because g10 is off.

Figure 6:
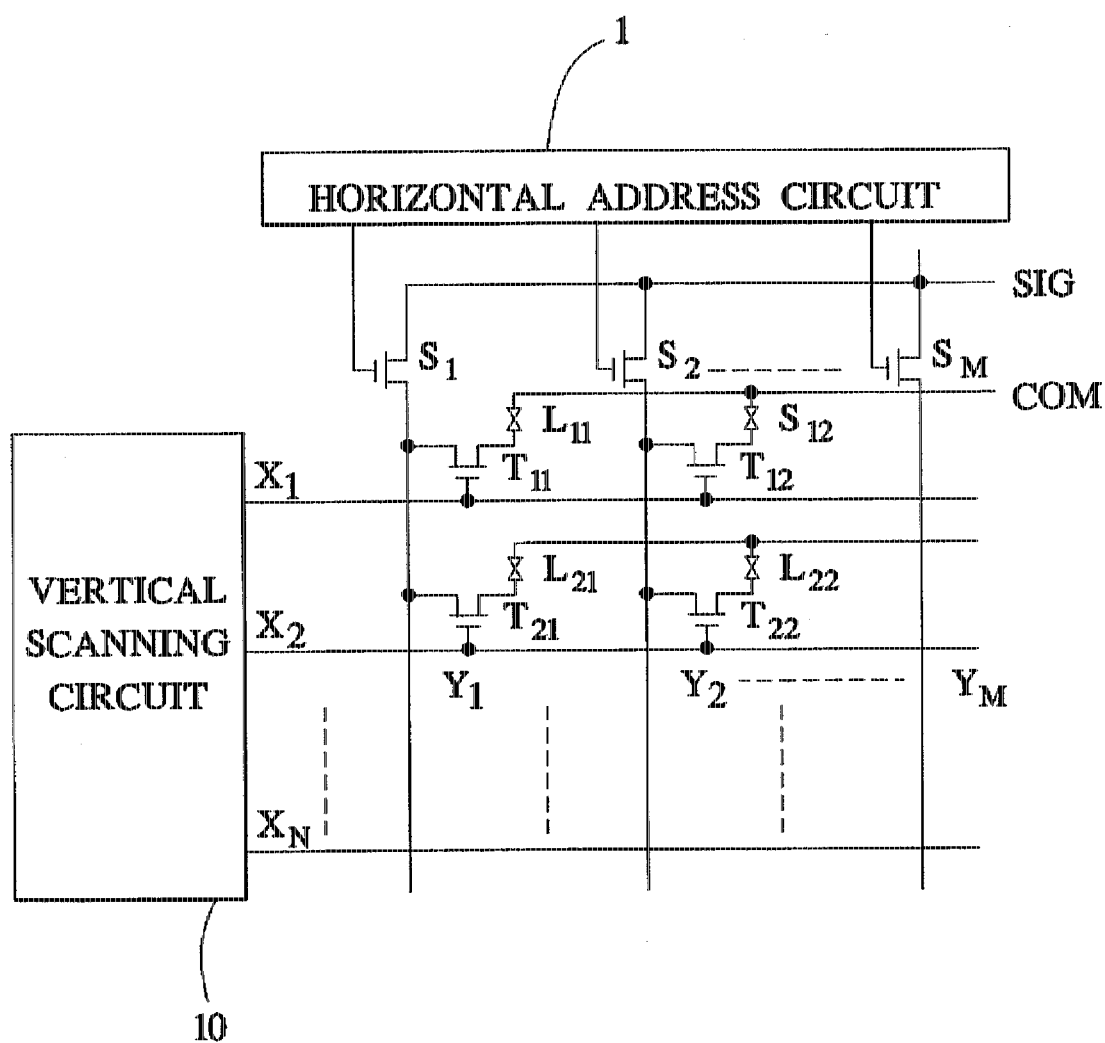
FIG. 6 is a circuit diagram showing an example structure of the active matrix display device of the present invention.
Figure 8A:
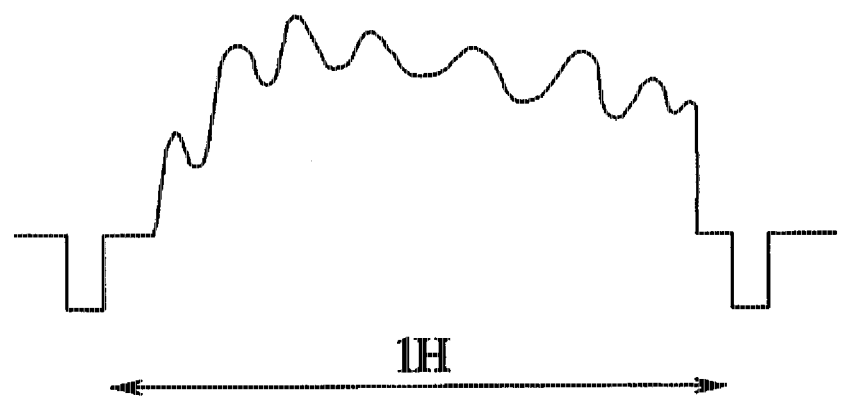
FIG. 8A and 8B are descriptional views showing a conventional method of changing over between a wide display and a normal display.
Figure 8B:
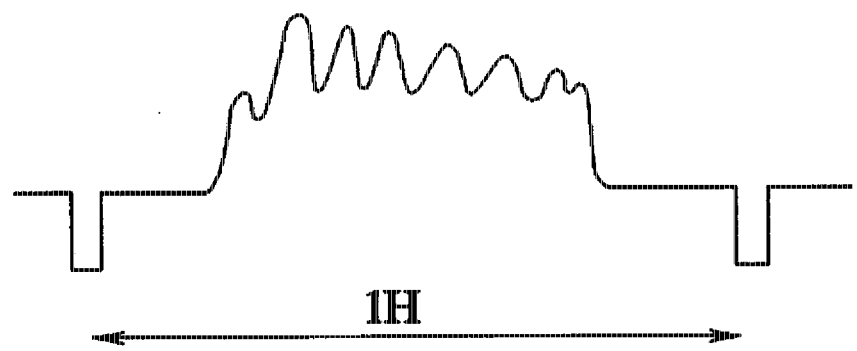

Finally, a specific example of a structure of an active matrix display device for the present invention will be described in detail with reference to FIG. 6. The active matrix display device has a flat panel structure comprised of a pair of boards arranged so as to face each other with a prescribed space in between, and a liquid crystal layer held within the space. Constructed at one of the boards are: N gate lines $X_1, X_2, \ldots, X_N$ arrayed along the row direction; M data lines $Y_1, Y_2, \ldots, Y_M$ arrayed along the column direction, active elements (TFT) $T_{11}, T_{12}, T_{21}, T_{22}, \ldots$ positioned at the intersections of each of the gate lines and data lines; pixel electrodes driven by individual active elements; a vertical scanning circuit 10 for line-sequentially providing a gate signal to each gate line $X_1, X_2, \ldots, X_N$; and a horizontal address circuit 1 for line-sequentially providing data signals SIG to each data line $Y_1, Y_2, \ldots Y_M$ via switching elements $S_1, S_2, \ldots, S_M$. This horizontal address circuit 1 has the construction shown in FIG. 1 and can be changed over between a wide display and a normal display. Opposing electrodes COM are formed at the other board, and liquid crystal pixels L11, L12, L21, L22, ... are constructed between the individual pixel electrodes, with the desired picture then being shown in accordance with potential differences. As mentioned above, the horizontal address circuit 1 includes a bi-directional shift register, which makes it possible to selectively invert the displaying of the image to the left and right. in for example, the case where the switching elements are scanned in the direction of S1 to SM by the horizontal address circuit 1, a positively inverted display is obtained. Conversely, when scanning the switching elements in the direction from $S_M$ to $S_1$, a left-right, negatively inverted display is obtained. The above is for the case of wide displaying, but when normal displaying is carried out just the intermediate switching elements SJ to SK are controlled so as to be opened and closed. The signals for controlling the opening and closing of each of the switching elements S are obtained from the output terminals for each flip-flop shown in FIG. 1.

As described above, according to the present invention, a horizontal address circuit is constructed from a single shift register. A shift register is formed by flip-flops equipped with a pair of input/output terminals which are multiple-stage connected, the number of which corresponds to the number of pixels in the entire row. It is possible to divide up the data transfer due to a simple construction where a wide input switch terminal and a normal input switch terminal are added to flip-flops at the leading positions of the wide display and the normal display. In this way, the digital processing carried out in the prior art is no longer necessary, and it becomes possible to carry out normal displaying on an active matrix display device having a screen for wide display use. It also becomes possible to ensure that the joint of the normal display and wide display is not visible by adding dummy input switch elements.

Although various minor changes and modifications might be proposed by those skilled in the art, it will be understood that my wish is to include within the claims of the patent warranted hereon all such changes and modifications as reasonably come within my contribution to the art.

What is claimed is:

1. An active matrix display device, comprising;
   a plurality of pixels arrayed in a matrix shave;
   a vertical scanning circuit for sequentially selecting pixels every line;
   a horizontal addressing circuit for dot-sequentially addressing selected line pixels, the circuit having a shift register formed of a number of multi-stage connected flip-flops corresponding to a total number of rows of pixels, with each flip-flop being equipped with a pair of input/output terminals and a prescribed start pulse being transferred every stage;
   a wide input switch element for inputting a start pulse to the input terminal of the flip-flop positioned at a leading stage during wide displaying;
   a normal input switch element for inputting a start pulse to the input terminal of the flip-flop positioned at a specific intermediate stage during normal displaying; and
   dummy input switch elements for load adjustment connected to input/output terminals of flip-flops in positions other than the leading stage and the specific intermediate stage.

2. An active matrix display device according to claim 1 wherein a connection gate element is provided between input and output terminals of a pair of flip-flops positioned at a wide display and normal display joint in such a manner that a start pulse transfer occurring at the joint is in a defined direction during wide displaying, and start pulse transfer at the joint is stopped during normal displaying.

3. An active matrix display device according to claim 1, wherein transfer gate elements are provided respectively between input/output terminals of pairs of flip-flops positioned at neighboring stages in such a manner that transfer of a start pulse is controlled so as to be in a forward direction or a reverse direction.

4. An active matrix display device according to claim 1 including an input terminal of a flip-flop positioned at a head of temporarily redundant stages not concerned with pixel dot-sequential addressing for normal displaying, the input terminal having a potential fixing dement connected thereto.

5. An active matrix display device according to claim 4 wherein said potential fixing element connects the input terminal to ground.

6. An active matrix display device according to claim 4 wherein said potential fixing element connects the input terminal to a power supply.

7. An active matrix display device according to claim 3 wherein said transfer gate elements are each comprised of a CMOS transistor.

8. An active matrix display device according to claim 3 wherein said transfer gate elements are each comprised of an analog switch of a NMOS transistor.

9. An active matrix display device according to claim 3 wherein each of said transfer gate elements are each comprised of an analog switch of a PMOS transistor.

10. An active matrix display device according to claim 1 wherein said dummy input switch elements are each comprised of a transmission gate of a CMOS transistor.

* * * * *